United States Patent
Chu et al.

(10) Patent No.: US 11,456,753 B2
(45) Date of Patent: Sep. 27, 2022

(54) SIGNAL PROCESSOR AND SIGNAL PROCESSING METHOD

(71) Applicant: Realtek Semiconductor Corporation, Hsinchu (TW)

(72) Inventors: Yuan-Jih Chu, Hsinchu (TW); Bo-Cheng Lin, Hsinchu (TW); Chia-Chang Lin, Hsinchu (TW); Li-Chung Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 7 days.

(21) Appl. No.: 17/202,773

(22) Filed: Mar. 16, 2021

(65) Prior Publication Data

US 2022/0116051 A1 Apr. 14, 2022

(30) Foreign Application Priority Data

Oct. 13, 2020 (TW) ................................ 109135396

(51) Int. Cl.
*H03M 5/12* (2006.01)
(52) U.S. Cl.
CPC ..................................... *H03M 5/12* (2013.01)
(58) Field of Classification Search
CPC ...................................................... H03M 5/12
See application file for complete search history.

(56) References Cited

U.S. PATENT DOCUMENTS

| 5,461,583 A * | 10/1995 | Fensch ................... H03B 28/00 708/845 |
| 2014/0098569 A1* | 4/2014 | Kohler ................... H01F 19/04 363/15 |
| 2017/0140767 A1* | 5/2017 | Li ........................... G10L 19/22 |
| 2018/0041366 A1* | 2/2018 | Xia ........................ H04B 1/385 |

* cited by examiner

*Primary Examiner* — Janice N Tieu
(74) *Attorney, Agent, or Firm* — Locke Lord LLP; Tim Tingkang Xia, Esq.

(57) ABSTRACT

A signal processor includes a signal receiving circuit, a pre-processing circuit, a period acquisition circuit, and a decoding circuit. The signal receiving circuit is configured to receive an input signal. The pre-processing circuit is configured to generate a square wave signal according to the input signal. The period acquisition circuit is configured to capture several periods of the square wave signal. The several signal periods includes several signal period groups, and each of the several signal period groups includes at least two signal periods of the several signal periods. The at least two signal periods are adjacent to each other. The decoding circuit is coupled to the period acquisition circuit and is configured to perform decoding according to a time length and a number of times of voltage value change of the several signal period groups to obtain a decoding result.

20 Claims, 5 Drawing Sheets

SIGNAL PROCESSOR AND SIGNAL PROCESSING METHOD

CROSS-REFERENCE TO RELATED APPLICATION

This application claims the priority benefit of TAIWAN Application serial no. 109135396, filed Oct. 13, 2020, the full disclosure of which is incorporated herein by reference.

FIELD OF INVENTION

The invention relates to a signal processor and a signal processing method, more particularly, the invention relates to a signal processor and a signal processing method for anti-radio frequency interference.

BACKGROUND

Automotive electronic systems have more stringent requirements for safety, and require anti-radio frequency interference (RFI) protection design. In order to simplify the circuit, based on the comparison circuit, after receiving the Differential Manchester Encoding (DME) defined by IEEE 802.3cg, after RFI compensation and the signal period is captured, it is determined that whether the rules for decoding the received signal comply with the DME definition, so as to obtain the decoding result.

If only the comparison circuit is used to receive the signal, since RFI will seriously affect the DME signal transmitted on the channel, causing the voltage change and cycle deformation of the DME signal, and the comparison circuit will also cause signal distortion when passing through the comparison circuit. After processing and directly decoding the received signal, the DME decoding mechanism cannot converge.

SUMMARY

An aspect of this disclosure is to provide a signal processor includes a signal receiving circuit, a pre-processing circuit, a period acquisition circuit, and a decoding circuit. The signal receiving circuit is configured to receive an input signal. The pre-processing circuit is coupled to the signal receiving circuit and is configured to generate a square wave signal according to the input signal. The period acquisition circuit is coupled to the pre-processing circuit and is configured to capture several periods of the square wave signal. The several signal periods includes several signal period groups, and each of the several signal period groups includes at least two signal periods of the several signal periods. The at least two signal periods are adjacent to each other. The decoding circuit is coupled to the period acquisition circuit and is configured to perform decoding according to a time length and a number of times of voltage value change of the several signal period groups to obtain a decoding result.

Another aspect of this disclosure is to provide a signal processing method. The signal processing circuit includes the following operations: receiving an input signal by a signal receiving circuit; generating a square wave signal according to the input signal by a pre-processing circuit; capturing a plurality of signal periods of the square wave signal by a period acquisition circuit, wherein the plurality of signal periods comprise a plurality of signal period groups, and each of the plurality of signal period groups comprises at least two signal periods of the plurality of signal periods, wherein the at least two signal periods are adjacent to each other; and performing decoding according to a time length and a number of times of voltage value change of the plurality of signal period groups to obtain a decoding result by a decoding circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The term "coupled" used in the article can also refer to "electrical coupling", and the term "connected" can also refer to "electrical connection". "Coupling" and "connection" can also be referred to two or more components that cooperate or interact with each other.

Figure 1:
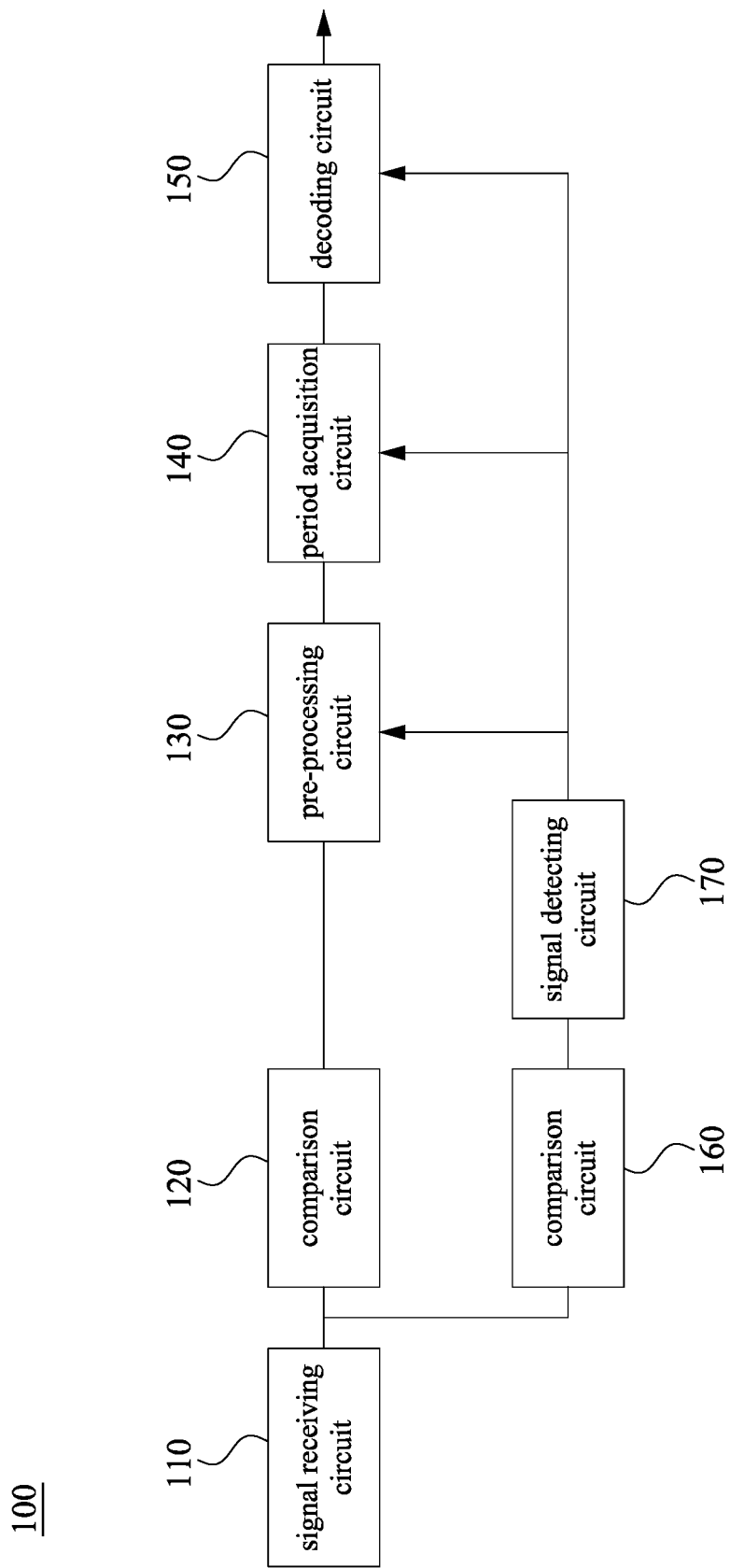
FIG. 1 is a schematic diagram illustrating a signal processor according to some embodiments of the present disclosure.

Reference is made to FIG. 1. FIG. 1 is a schematic diagram illustrating a signal processor 100 according to some embodiments of the present disclosure. For example, the signal processor 100 can be automotive electronic differential Manchester encoding detection and radio frequency interference canceller.

As illustrated in FIG. 1, the signal processor 100 includes a signal receiving circuit 110, a comparison circuit 120, a pre-processing circuit 130, a period acquisition circuit 140, a decoding circuit 150, a comparison circuit 160 and a signal detecting circuit 170. In the connection relationship, the signal receiving circuit 110 is coupled to the comparison circuit 120 and the comparison circuit 160. The comparison circuit 120 is coupled to the pre-processing circuit 130. The comparison circuit 160 is coupled to the signal detecting circuit 170. The pre-processing circuit 130 is coupled to the comparison circuit 120. The period acquisition circuit 140 is coupled to the pre-processing circuit 130. The decoding circuit 150 is coupled to the period acquisition circuit 140. The signal detecting circuit 170 is coupled to the pre-processing circuit 130, the period acquisition circuit 140 and the decoding circuit 150.

In some embodiments, the comparison circuit 120 is a low threshold value comparison circuit, and the comparison circuit 160 is a high threshold value comparison circuit.

The configuration of the signal processor 100 mentioning above is for illustrative purposes only, and various configurations of the signal processor 100 are within the scope of the present disclosure. The detailed operation method of the signal processor 100 will be explained in reference to FIG. 2 below.

Figure 2:
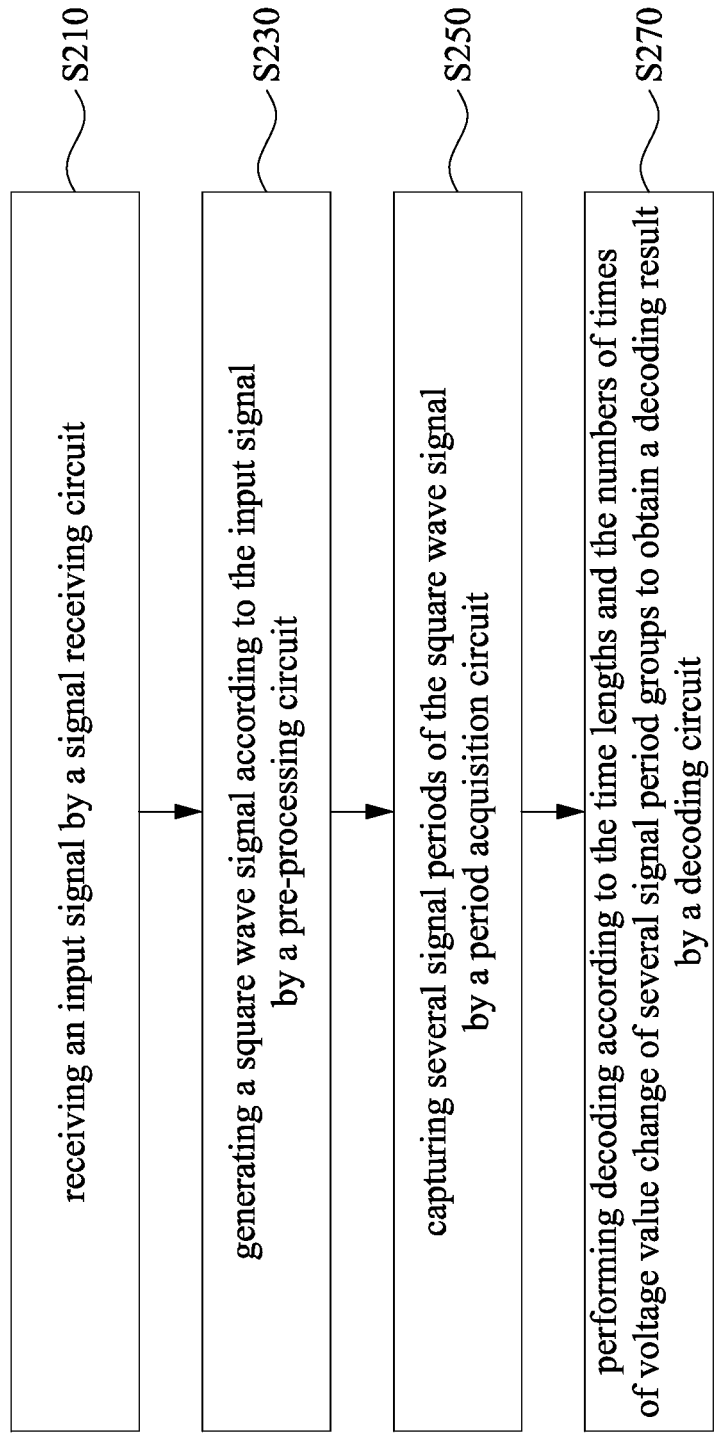
FIG. 2 is a flow chart illustrating a signal processing method according to some embodiments of the present disclosure.

FIG. 2 is a flow chart illustrating a signal processing method 200 according to some embodiments of the present disclosure. The signal processing method 200 can be applied to the signal processor 100 shown in FIG. 1. Reference is made to FIG. 1 and FIG. 2 at the same time.

In operation S210, an input signal is received by a signal receiving circuit. In some embodiments, the input signal is transmitted by the signal transmitter (not shown) and is received by the signal receiving circuit 110. In some embodiments, after the signal receiving circuit 110 receives the input signal, the input signal is transmitted to the comparison circuit 120. The comparison circuit 120 is configured to compare the voltage value of the input signal, and to transmit the compared input signal to the pre-processing circuit 130.

In operation S230, a square wave signal is generated according to the input signal by the pre-processing circuit. In some embodiments, after the pre-processing circuit 130 receives the compared input signal, the square wave signal is generated according to the input signal.

Figure 3:
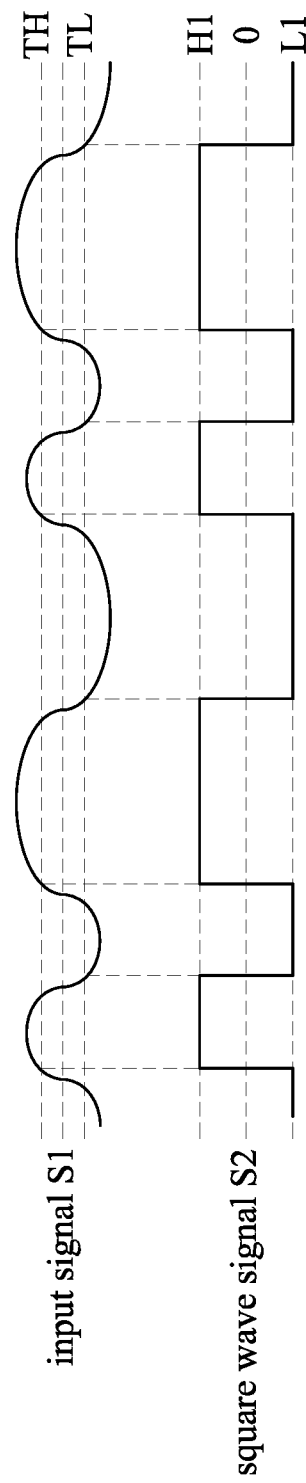
FIG. 3 is a schematic diagram illustrating a square wave signal according to some embodiments of the present disclosure.

Reference is made to FIG. 3 together. FIG. 3 is a schematic diagram illustrating a square wave signal S2 according to some embodiments of the present disclosure. As illustrated in FIG. 3, the square wave signal S2 is generated according to the input signal S1. In detail, in some embodiments, when the voltage value of the input signal S1 is larger than the high voltage threshold value TH, the pre-processing circuit 130 set the voltage value to be a high voltage value H1. On the contrary, when the voltage value of the input signal S1 is smaller than the low voltage value threshold value TL, the pre-processing circuit 130 set the voltage value to be a high voltage value L1.

In some embodiments, the input signal is processed by differential Manchester encoding, but the embodiments of the present disclosure are not limited by the coding method.

Figure 4:
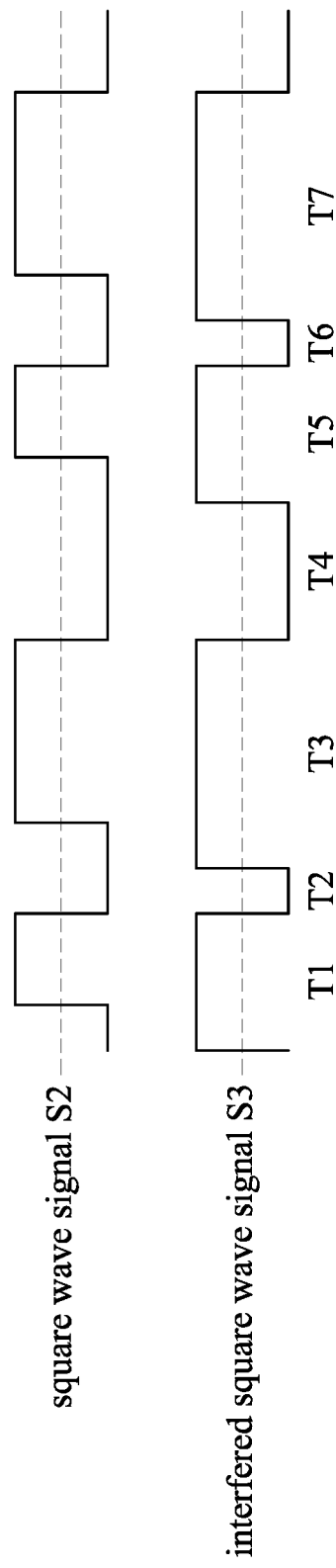
FIG. 4 is a schematic diagram illustrating an interfered square wave signal according to some embodiments of the present disclosure.

However, it should be noted that, due to the influence of the radio frequency and the comparison circuit 120, the signal periods being processed by the pre-processing circuit 130 are different from the signal periods of the input signal. Reference is made to FIG. 4 together. FIG. 4 is a schematic diagram illustrating an interfered square wave signal S3 according to some embodiments of the present disclosure. As illustrated in FIG. 4, after being affected by the interference, the period of 0 and 1 encrypted by the differential Manchester encoding transmitted in the square wave signal may become the same size or deformed. For example, decoding is unable to be performed by simply observing the period of the existing interfered square wave signal S3.

In operation S250, several signal periods of the square wave signal is captured by the period acquisition circuit. In some embodiments, the period acquisition circuit 140 in FIG. 1 captures several signal periods of the interfered square wave signal S3 in FIG. 4. For example, the signal periods T1 to T7 in FIG. 4 are obtained by the period acquisition circuit 140. Since the periods in the interfered square wave signal S3 has been deformed by interference, the time lengths of several signal periods T1 to T7 are not exactly the same. Several signal periods T1 to T7 are separated into several signal period groups, and several signal period groups include at least two signal periods of the several signal periods T1 to T7, in which the at least two signal periods are adjacent to each other. In some embodiments, the signal period groups overlap each other.

For example, when the signal periods T1 to T3 in FIG. 4 are the first signal period group and the signal periods T3 to T4 are the second signal period group, the first signal period group and the second signal period group overlap each other.

In operation S270, decoding is performed by the decoding circuit according to the time lengths and the numbers of times of voltage value change of several signal period groups to obtain a decoding result. In some embodiments, the decoding circuit 150 in FIG. 1 determines the decoding result according to the time lengths and the numbers of times of the voltage value change of the several signal period groups. In some embodiments, the decoding circuit 150 stores a look up table. The decoding circuit 150 compares the time lengths and the numbers of times of voltage value change with the look up table to determine the decoding result.

In some embodiments, the look up table is a decoding mechanism determined by simulating and counting the periodic changes of the permutation and combination of different differential Manchester encoding.

In some embodiments, the time length of the signal period groups is at least twice, or about twice, that of the differential Manchester encoding. For example, when a period time length of a differential Manchester encoding symbol is 80 ns, if it is subject to radio frequency interference, the rate of change of the period is relatively large. However, if more than two periods of consecutive differential Manchester encoding symbols are used to observe the time length of 160 ns, the rate of change after being affected by the radio frequency interference is small, so that the symbols of the differential Manchester encoding can be decoded more correctly.

For example, reference is made to FIG. 4. Assuming that there are signal periods T1 to T3, that is, a signal period group, around 160 ns, the decoding circuit 150 knows that the three signal periods T1 to T3 are composed of a 0 in the differential Manchester encoding and a 1 in the differential Manchester encoding according to the coding rules obtained by simulation statistics. Then, assuming that there are signal periods T3 to T4, that is, a signal period group, around 160 ns, the decoding circuit 150 knows that the two signal periods T3 to T4 are composed of two 0s in the differential Manchester encoding. In this way, the decoding circuit 150 can determine that the signal periods T1 to T4 include the decoding result of 1, 0, and 0 of the differential Manchester encoding.

It should be noted that, the embodiments mentioning above take 160 ns as the detection boundary as an example. However, the embodiments of the present disclosure are not limited thereto.

Figure 5:
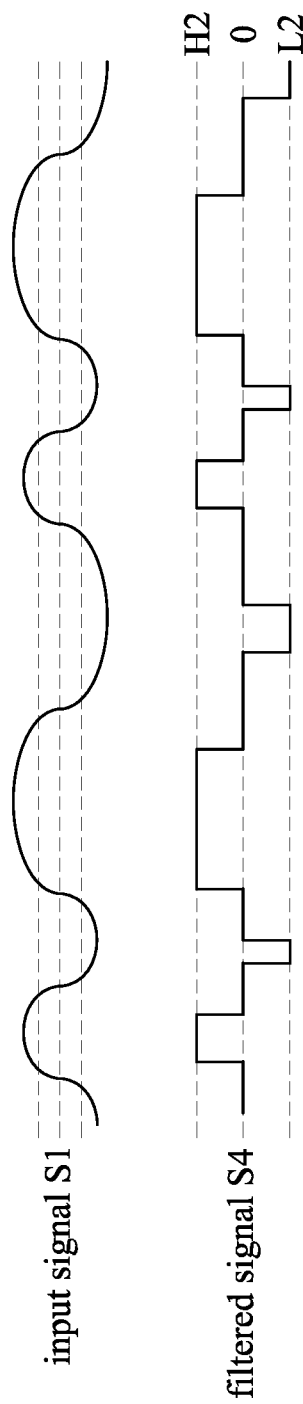
FIG. 5 is a schematic diagram illustrating a filtered signal according to some embodiments of the present disclosure.

Reference is made to FIG. 1 again. In some embodiments, the comparison circuit 160 is configured to filter the input signal to generate the filtered signal. Reference is made to FIG. 5 again. FIG. 5 is a schematic diagram illustrating a filtered signal S4 according to some embodiments of the present disclosure. In some embodiments, the comparison circuit 160 is further configured to determine whether the absolute value of the voltage value of the input signal is smaller than the threshold voltage value or not, and when the absolute value of the voltage value of the input signal is smaller than the threshold voltage value, the voltage value is filtered.

For example, in FIG. 5, when the voltage value of the input signal S1 is not larger than the threshold voltage value TH or not smaller than the threshold voltage value TL, the filter voltage value is set with the voltage value of 0. When the voltage value of the input signal S1 is larger than the threshold voltage value TH, the voltage value is set to be H2, and when the voltage value of the input signal S1 is smaller than the threshold voltage value TL, the voltage value is set to be L2.

In some embodiments, the signal detecting circuit 170 determines whether the valid signal is included according to the filtered signal S4. In some embodiments, when the voltage value of the filtered signal S4 is larger than the threshold voltage value, it is determined that the valid signal is included.

In some embodiments, when it is determined that the valid signal is included, the signal detecting circuit 170 controls the pre-processing circuit 130, the period acquisition circuit 140 and the decoding circuit 150 to be actuated. On the contrary, when it is determined that the valid signal is not included, the signal detecting circuit 170 controls the pre-processing circuit 130, the period acquisition circuit 140 and the decoding circuit 150 not to be actuated, and the pre-processing circuit 130, the period acquisition circuit 140 and the decoding circuit 150 are cleared.

In detail, even if the differential Manchester encoding signal is affected by the radio frequency interference, there will still be enough voltage to exceed the comparison threshold value of the comparison circuit 160. Therefore, as long as the output of the comparison circuit 160 is observed to have positive and negative changes within the estimated time, it can be expected that there may be a differential Manchester encoding signal in the future, and then the pre-processing circuit 130, period acquisition circuit 140 and decoding circuit 150 may be actuated. On the other hand, when the radio frequency interference or noise occurs, since most of the voltage value is not enough to exceed the comparison threshold value of the comparison circuit 160, even when a DC bias appears on the channel of the input signal which makes the voltage of the input signal affected by the radio frequency interference sometimes exceeds the threshold value of the comparison circuit 160, the output of the comparison circuit 160 will not change positively or negatively. At this time, circuits such as the pre-processing circuit 130, the period acquisition circuit 140 and the decoding circuit 150 will not try to decode the signal on the channel to save unnecessary power consumption. At the same time, the phenomenon that the decoding circuit mistakenly regards the RF interference signal as a differential Manchester encoding signal for decoding when the frequency of the RF interference signal is close to that of the differential Manchester encoding signal is avoided. The embodiments of the present disclosure detect the electronic differential Manchester encoding for vehicles and eliminate the radio frequency interference.

According to embodiments of the present disclosure, it is understood that the embodiments of the present disclosure provide a signal processor and a signal processing method, by observing and decoding several times of the periods of the symbols of the differential Manchester encoding signal to overcome the period variation of the differential Manchester encoding signal caused by radio frequency interference, and the differential Manchester encoding signal encoding content are correctly interpreted. In addition, the input signal is filtered by a comparison circuit with a high comparison threshold value, and the subsequent decoding circuit is controlled whether to perform a decoding operation or not according to the result of the filter, so as to save unnecessary power consumption.

Various functional elements have been disclosed herein. For those skilled in the art, functional elements can be implemented by circuits (whether a dedicated circuit or a general-purpose circuit operated under the control of one or more processors and coded instructions).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A signal processor, comprising:
   a signal receiving circuit, configured to receive an input signal;
   a pre-processing circuit, coupled to the signal receiving circuit, configured to generate a square wave signal according to the input signal;
   a period acquisition circuit, coupled to the pre-processing circuit, configured to capture a plurality of signal periods of the square wave signal, wherein the plurality of signal periods comprise a plurality of signal period groups, and each of the plurality of signal period groups comprises at least two signal periods of the plurality of signal periods, wherein the at least two signal periods are adjacent to each other; and
   a decoding circuit, coupled to the period acquisition circuit, configured to perform decoding according to a time length and a number of times of voltage value change of the plurality of signal period groups to obtain a decoding result.

2. The signal processor of claim 1, wherein the decoding circuit is further configured to store a look up table.

3. The signal processor of claim 2, wherein the decoding circuit is further configured to compare the time length and the number of times of voltage value change with the look up table to determine the decoding result.

4. The signal processor of claim 1, further comprising:
   a comparison circuit, coupled between the signal receiving circuit and the pre-processing circuit, configured to compare a voltage value of the input signal.

5. The signal processor of claim 1, further comprising:
   a comparison circuit, coupled between the signal receiving circuit and the pre-processing circuit, configured to filter the input signal to generate a filtered signal.

6. The signal processor of claim 5, wherein when an absolute value of a voltage value of the input signal is smaller than a threshold voltage value, the voltage value is filtered.

7. The signal processor of claim 5, further comprising:
   a signal detecting circuit, configured to determine whether a valid signal is comprised or not according to the filtered signal.

8. The signal processor of claim 7, wherein when the valid signal is comprised, the pre-processing circuit, the period acquisition circuit and the decoding circuit are actuated; when the valid signal is not comprised, the pre-processing circuit, the period acquisition circuit and the decoding circuit are not actuated.

9. The signal processor of claim 6, wherein when a voltage value of the filtered signal is larger than a threshold voltage value, it is determined that the valid signal is comprised.

10. The signal processor of claim 1, wherein the plurality of signal period groups overlap each other.

11. A signal processing method, comprising:
    receiving an input signal by a signal receiving circuit;

generating a square wave signal according to the input signal by a pre-processing circuit;

capturing a plurality of signal periods of the square wave signal by a period acquisition circuit, wherein the plurality of signal periods comprise a plurality of signal period groups, and each of the plurality of signal period groups comprises at least two signal periods of the plurality of signal periods, wherein the at least two signal periods are adjacent to each other; and performing decoding according to a time length and a number of times of voltage value change of the plurality of signal period groups to obtain a decoding result by a decoding circuit.

12. The signal processing method of claim 11, further comprising:

comparing the time length and the number of times of voltage value change with a look up table to determine the decoding result.

13. The signal processing method of claim 11, further comprising:

comparing a voltage value of the input signal by a comparison circuit.

14. The signal processing method of claim 11, further comprising:

filtering the input signal to generate a filtered signal by a comparison circuit.

15. The signal processing method of claim 14, further comprising:

determining whether an absolute value of a voltage value of the input signal is smaller than a threshold voltage value or not; and filtering the voltage value when the absolute value of the voltage value of the input signal is smaller than the threshold voltage value.

16. The signal processing method of claim 14, further comprising:

determining whether a valid signal is comprised or not according to the filtered signal.

17. The signal processing method of claim 16, further comprising:

actuating the pre-processing circuit, the period acquisition circuit and the decoding circuit when the valid signal is comprised; and not actuating the pre-processing circuit, the period acquisition circuit and the decoding circuit when the valid signal is not comprised.

18. The signal processing method of claim 16, further comprising:

determining that the valid signal is not comprised when a voltage value of the filtered signal is not 0.

19. The signal processing method of claim 16, further comprising:

determining that the valid signal is comprised when a voltage value of the filtered signal is larger than a threshold voltage value.

20. The signal processing method of claim 11, wherein the plurality of signal period groups overlap each other.

* * * * *